US007358651B2

(12) United States Patent
Ruby et al.

(10) Patent No.: US 7,358,651 B2
(45) Date of Patent: Apr. 15, 2008

(54) APPARATUS AND METHOD FOR DETECTING A TARGET ENVIRONMENTAL VARIABLE THAT EMPLOYS FILM-BULK ACOUSTIC WAVE RESONATOR OSCILLATORS

(75) Inventors: Richard C. Ruby, Menlo Park, CA (US); Graham M. Flower, San Jose, CA (US); John D. Larson, III, Palo Alto, CA (US); Mark A. Unkrich, Emerald Hills, CA (US)

(73) Assignee: Avago Technologies Wireless (Singapore) Pte. Ltd., Singapore (SG)

( * ) Notice: Subject to any disclaimer, the term of this patent is extended or adjusted under 35 U.S.C. 154(b) by 350 days.

(21) Appl. No.: 11/109,108

(22) Filed: Apr. 18, 2005

(65) Prior Publication Data

US 2006/0232163 A1   Oct. 19, 2006

(51) Int. Cl.
   *H01L 41/08* (2006.01)
(52) U.S. Cl. ............... 310/334; 310/324; 310/320
(58) Field of Classification Search ........... 310/320, 310/324, 312
   See application file for complete search history.

(56) References Cited

U.S. PATENT DOCUMENTS

| 5,873,153 | A | 2/1999 | Ruby et al. |
|---|---|---|---|
| 6,060,818 | A | 5/2000 | Ruby et al. |
| 6,228,675 | B1 | 5/2001 | Ruby et al. |
| 6,265,246 | B1 | 7/2001 | Ruby et al. |
| 6,376,280 | B1 | 4/2002 | Ruby et al. |
| 6,469,597 | B2 * | 10/2002 | Ruby et al. ............ 333/187 |
| 6,566,979 | B2 * | 5/2003 | Larson et al. .......... 333/187 |
| 6,651,488 | B2 | 11/2003 | Larson et al. |
| 6,668,618 | B2 | 12/2003 | Larson et al. |
| 6,874,211 | B2 * | 4/2005 | Bradley et al. ......... 29/25.35 |
| 6,924,583 | B2 * | 8/2005 | Lin et al. ............... 310/324 |
| 2002/0152803 | A1 | 10/2002 | Larson, III et al. |
| 2004/0150296 | A1 | 8/2004 | Park et al. |

FOREIGN PATENT DOCUMENTS

GB   2 411 239 A   8/2005

OTHER PUBLICATIONS

Search report from corresponding application No. GB0605225.2.
Search report from corresponding application No. GB0605225.2, no date available.

* cited by examiner

*Primary Examiner*—Mark Budd

(57) ABSTRACT

An apparatus and method for detecting a target environmental variable (TEV). A first film-bulk acoustic resonator (FBAR) oscillator that includes a first FBAR with a first response to the target environmental variable generates a first frequency. A second film-bulk acoustic resonator (FBAR) oscillator that includes a second FBAR with a second response to the target environmental variable generates a second frequency. A circuit that is coupled to the first FBAR oscillator and the second FBAR oscillator determines the target environmental variable (e.g., changes in the TEV) based on the first frequency and the second frequency.

8 Claims, 8 Drawing Sheets

TEV DETECTION APPARATUS 100

APPARATUS AND METHOD FOR DETECTING A TARGET ENVIRONMENTAL VARIABLE THAT EMPLOYS FILM-BULK ACOUSTIC WAVE RESONATOR OSCILLATORS

BACKGROUND OF THE INVENTION

Capacitive pressure sensors are well known in the prior art. A typical pressure sensor includes a fixed element with a rigid, planar conductive surface that forms one plate of a substantially parallel plate capacitor. A displacable (relative to the fixed element) conductive member, such as a metal diaphragm, or a plated non-conductive member, such as a metalized ceramic diaphragm, forms the other plate of the capacitor.

The diaphragm is edge-supported so that a central portion is substantially parallel to and opposite the fixed plate. Because the sensor generally has the form of a parallel plate capacitor, the characteristic capacitance C of the sensor may be approximated by the equation: C=($\epsilon$*A)/d, where epsilon ($\epsilon$) is the permittivity of the material between the parallel plates, A is the surface area of the parallel plate, and d represents the gap between the plates. It is noted that the characteristic capacitance is inversely proportional to the gap between a central portion of the diaphragm and the conductive surface of the fixed element. In order to permit a pressure differential to develop across the diaphragm, the region on one side of the diaphragm is typically sealed from the region on the opposite side.

The diaphragm elasticity is selected so that pressure differentials across the diaphragm in a particular range of the interest cause displacements of the central portion of the diaphragm. These pressure differential-induced displacements result in corresponding variations in the gap, d, between the two capacitor plates, and thus in capacitance variations produced by the sensor capacitor. For relatively high sensitivity, such sensors require large changes of capacitance in response to relatively small gap changes.

In one prior art approach, the sensor capacitor, which is formed by the fixed conductive surface and the diaphragm, is electrically coupled through conductors to an oscillator circuit. The oscillator circuit typically includes an inductor that forms a tank circuit with the sensor capacitor. This LC tank circuit provides a frequency reference for the oscillator circuit; the output frequency of which is a direct function of the resonant frequency of the tank circuit. The resonant frequency of the tank circuit is in turn a direct function of the inductance L of the inductor and the capacitance C of the sensor capacitor. It is well known to those in the art that the resonant frequency ($\omega_0$) of a simple LC tank circuit is given by $$\omega_0 = \frac{1}{\sqrt{LC}}.$$

As long as the values of the inductor and the capacitor both remain fixed, the output frequency of the oscillator circuit remains constant. However, since the capacitance of the sensor capacitor varies as a function of the pressure applied to the diaphragm, the output frequency of the oscillator circuit also varies as a direct function of the applied pressure. Such a configuration produces a signal whose frequency is indicative of the pressure applied to the remote sensor.

One disadvantage to capacitive pressure sensors with this configuration is the low resonant frequency at which the oscillator circuit operates. Another disadvantage to the capacitive pressure sensors with this configuration is that the manufacture of the sensor capacitor and the oscillator circuit is often complex.

Yet another disadvantage to the prior art capacitive pressure sensors is that the size of the resulting sensor capacitor and the oscillator circuit is often bulky and space inefficient. Consequently, these prior art capacitive pressure sensors may not meet the stringent size and space requirements of portable or other compact applications.

Based on the foregoing, there remains a need for an apparatus and method for detecting a target environmental variable (TEV) that overcomes the disadvantages set forth previously.

SUMMARY OF THE INVENTION

According to one embodiment of the present invention, an apparatus and method for detecting a target environmental variable (TEV) that employs film-bulk acoustic wave resonator oscillators are described. A first film-bulk acoustic resonator (FBAR) oscillator that includes a first FBAR with a first response to the target environmental variable generates a first frequency. A second film-bulk acoustic resonator (FBAR) oscillator that includes a second FBAR with a second response to the target environmental variable generates a second frequency. A circuit that is coupled to the first FBAR oscillator and the second FBAR oscillator determines the target environmental variable (e.g., changes in the TEV) based on the first frequency and the second frequency.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

Apparatus and method for detecting a target environmental variable (TEV) that employs film-bulk acoustic wave resonator (FBAR) oscillators are described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Target Environmental Variable (TEV) Detection Apparatus

Figure 1:
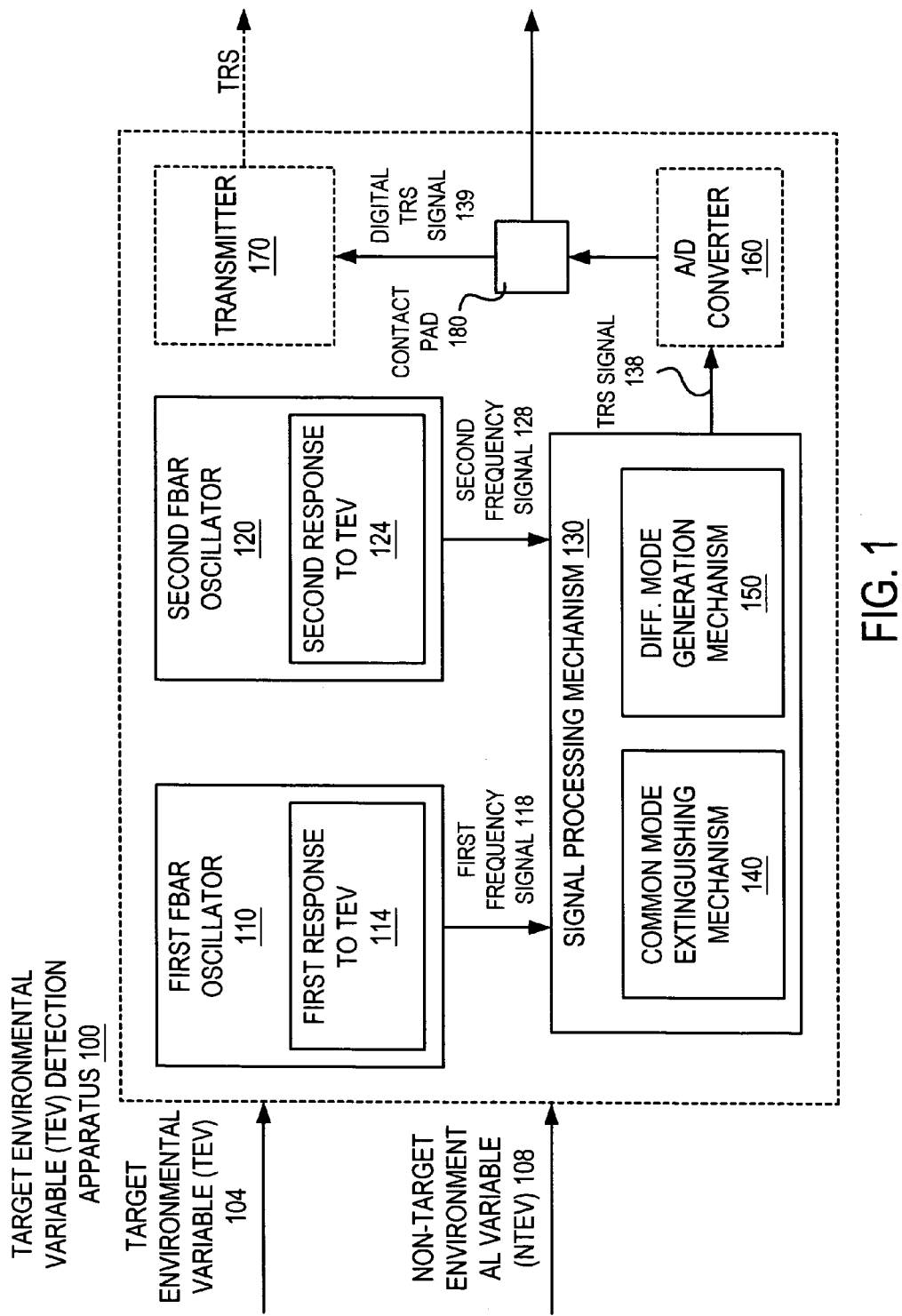
FIG. 1 illustrates a target environmental variable (TEV) detection apparatus that utilizes FBAR oscillators according to one embodiment of the invention.

FIG. 1 illustrates a target environmental variable (TEV) detection apparatus 100 that utilizes FBAR oscillators 110, 120 according to one embodiment of the invention. The target environmental variable (TEV) detection apparatus 100 (hereinafter "TEV detection apparatus") is exposed to a target environmental variable (TEV) 104 (also referred to herein as a "target environmental factor (TEF)"), which is a variable that is currently being detected or measured by apparatus 100 and at least one non-target environmental variable (NTEV) 108 (also referred to herein as a "non-target environmental factor (NTEF)"), which can be any environmental variable that is not of interest or not being detected.

The target external variable (TEV) 104 can include, but is not limited to pressure, temperature, humidity, acceleration, vibration, and sound (e.g., microphone applications). The NTEV 108 can also include can include, but is not limited to pressure, temperature, humidity, acceleration, vibration, and sound as long as the variable or factor is not under study or not of interest.

The TEV detection apparatus 100 includes a first film-bulk acoustic wave resonator oscillators (FBAR) oscillator 110 that generates a first frequency signal (f_1) 118, a second film-bulk acoustic wave resonator oscillators (FBAR) oscillator 120 that generates a second frequency signal (f_2) 128, and a signal processing mechanism 130. The first FBAR 110 includes a first response 114 to the TEV 104, and the second FBAR 120 includes a second response 124 to the TEV 104 that is different from the first response 114. In one example, the TEV 104 alters or changes the resonant properties of the FBAR resonator. These resonant properties can include, but are not limited to, resonant frequency or a quality factor (Q) of the resonance. The signal processing mechanism 130 generates a TEV representative signal (TRS) 138 based on the first frequency signal 118 and the second frequency signal 128.

In an alternative embodiment, the signal processing mechanism 130 can be disposed remote from the first FBAR oscillator 110 and the second FBAR oscillator 120. For example, digital information may be modulated onto a carrier wave and transmitted to the signal processing mechanism 130.

In one embodiment, the first FBAR oscillator 110 and the second FBAR oscillator 120 are arranged in a side-by-side configuration that is described in greater detail hereinafter with reference to FIG. 3.

It is noted that the first FBAR 110 and the second FBAR 120 are configured so that the response of the first FBAR 110 to the TEV 104 and the response of the second FBAR 120 to the TEV 104 are different. In other words, one FBAR (e.g., first FBAR 110) is sensitized to the TEV 104 while another FBAR (e.g., the second FBAR 120) is not sensitized to the TEV 104 or not sensitized to the same degree or amount as the first FBAR 110.

Various means and techniques, which are described in greater detail hereinafter, are employed so that the response 114 of the first FBAR 110 is different than the response 118 of the second FBAR 120 to the TEV 104. However, at the same time, the first FBAR 110 and the second FBAR 120 are configured so that the response of the first FBAR 110 to non-target environmental variables (NTEVs) 108 and the response of the second FBAR 120 to non-target environmental variables (NTEVs) 108 are about the same.

The first FBAR 110 and the second FBAR 120 operate as a differential pair that has a common mode and a differential mode. In the common mode, the response of the first FBAR 110 to NTEVs 108 and the response of the second FBAR 120 to NTEVs 108 are extinguished due to factors, such as the proximity of the first FBAR 110 and the second FBAR 120 to each other. In other words, similarities in the responses to the NTEVs 108 by the first FBAR 110 and by the second FBAR 120 are cancelled out or extinguished. In the differential mode, the difference between the response of the first FBAR 110 to the TEV 104 and the response of the second FBAR 120 to the TEV 104 is enhanced.

The TEV detection apparatus 100 can optionally include an analog-to-digital converter (A/D) 160 that receives the TRS 138, which is an analog signal and generates a corresponding digital signal (e.g., digital TRS signal 139).

It is noted that the TEV detection apparatus 100 can include one or more contact pads that may be utilized to read out the TRS. For example, the TEV detection apparatus 100 can include a contact pad 180 that may be utilized to read out or otherwise access a digital TRS 139. Another contact pad (not shown) may be provided in another embodiment for use in accessing or reading out the TRS 138.

The TEV detection apparatus 100 can also optionally include a transmitter 170 that transmits a digital TRS 139 to a receiver (not shown) through a wireless link (e.g., a radio frequency (RF) communication link).

Exemplary Implementation of TEV Detection Apparatus 100

Figure 2:
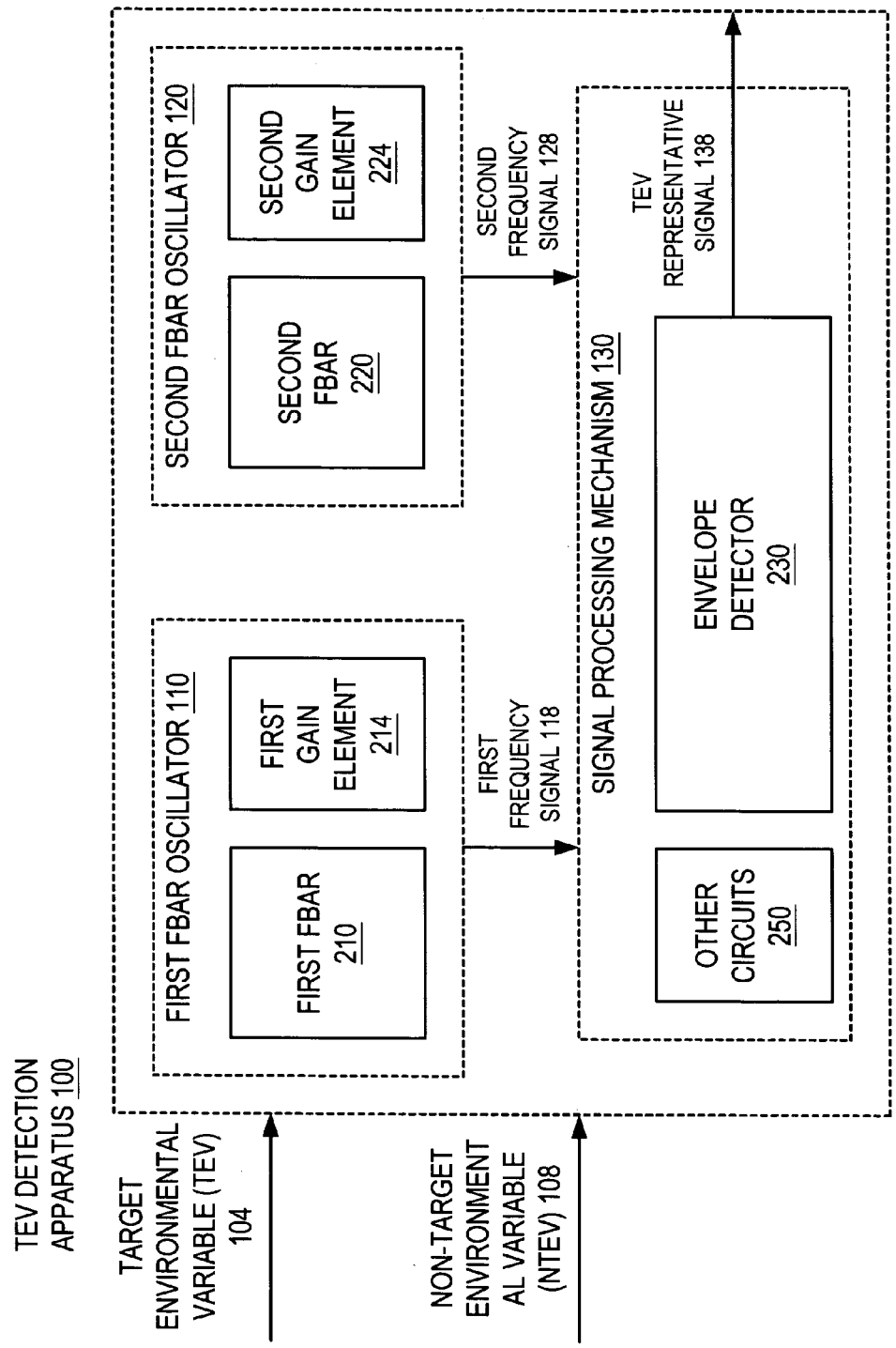
FIG. 2 illustrates in greater detail an exemplary implementation of the target environmental variable (TEV) detection apparatus of FIG. 1 according to one embodiment of the invention.

FIG. 2 illustrates in greater detail an exemplary implementation of the target environmental variable (TEV) detection apparatus 100 of FIG. 1 according to another embodiment of the invention. The first FBAR oscillator 110 includes a first FBAR 210 and a first gain element 214. The second FBAR oscillator 120 includes a second FBAR 220 and a second gain element 224. The first gain element 214 and the second gain element 224 can be, for example, a bipolar transistor gain element or a field effect transistor gain element. An exemplary embodiment of the first FBAR 210 and the second FBAR 220 is described in greater detail hereinafter with reference to FIG. 3.

The signal processing mechanism 130 can be a circuit 230 that generates a TEV representative signal (TRS) 138 based on the first frequency signal (f_1) 118 and the second frequency signal (f_2) 128. The circuit 230 can be, for example, an envelope detector 230 that generates a sum of the frequencies (e.g., f_1+f_2) and a difference of the frequencies (e.g., $\Delta f = f\_1 - f\_2$). Circuit 230 can be any means that generates a sum of the frequencies and a difference ($\Delta f$) of the frequencies In one embodiment, the difference ($\Delta f$) in carrier frequencies of the first oscillator 110 and the second oscillator 120 is low enough or small enough to be measured by inexpensive electronics. Changes in the beat frequency (or changes in the difference frequency) occur due to the change in a TEV 104 that a modified or sensitized FBAR (either first FBAR 210 or second FBAR 220) is configured to detect or sense. By measuring changes in the beat frequency or changes in the difference frequency, changes in the TEV 104 may be detected.

Other circuits 250 can include circuits that convert the changing "beat" frequency (due to the TEV under study) into digital signals. These digital signals can then be read out to an external circuit, directly inputted into a processor (e.g., a computer) or transmitted through a wireless link (e.g., through an RF link) to a receiving device (e.g., a base station or other receiver).

The first frequency signal 118 is also referred to herein as a first carrier frequency signal 118 of the first FBAR oscillator 110. Similarly, the second frequency signal 128 is also referred to herein as a second carrier frequency signal 128 of the second FBAR oscillator 120. In one embodiment, the difference (Δf) between the first carrier signal 118 and the second carrier signal 128 is much less than either the first carrier frequency signal 118 or the second carrier frequency signal 128. For example, the difference (Δf) in the first frequency 118 and the second frequency 128 may be in the range of about 1% to about 10% of either the first carrier frequency signal 118 or the second carrier frequency signal 128. When f_1 or f_2 are about 2 GHz, the difference in frequency (Δf) may be for example about 2 MHz or about 20 MHz.

Another Exemplary Implementation of TEV Detection Apparatus 100

Figure 3:
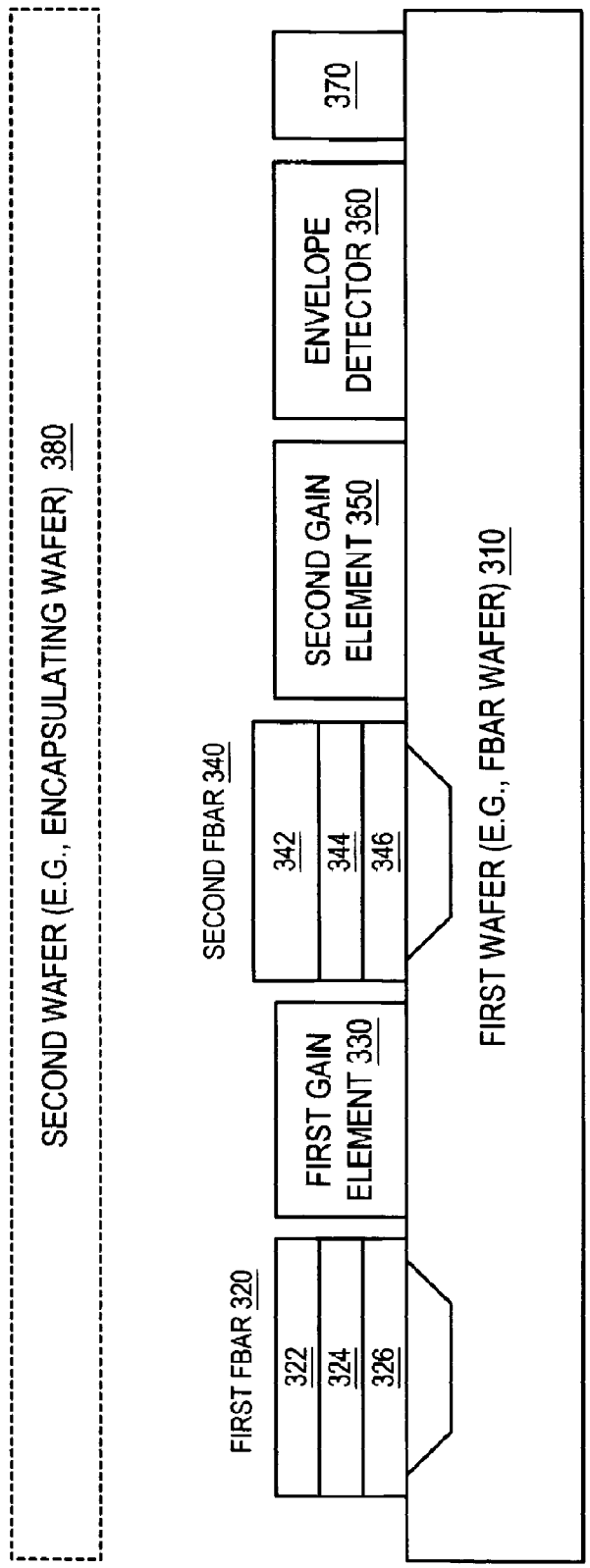
FIG. 3 illustrates another exemplary implementation of the target environmental variable (TEV) detection apparatus of FIG. 1 according to a another embodiment of the invention.

FIG. 3 illustrates an exemplary implementation of the detection apparatus 100 of FIG. 1 according to a one embodiment of the invention. The first FBAR 320 and the second FBAR 330 are formed on an FBAR wafer 310 by using manufacturing processes that are known by those of ordinary skill in the art. For example, U.S. Pat. Nos. 6,060, 818 5,873,153 describes methods for fabricating FBARs. In general, each FBAR includes two conductor layers (e.g., two metal layers) that sandwich a piezoelectric (PZ) layer that can be manufactured from, for example, aluminum nitride (AlN). For example, the first FBAR 320 includes a bottom electrode 326 (e.g., a first conductive layer), a top electrode 322 (e.g., a second conductive layer), and an AlN layer 324. Similarly, the second FBAR 340 includes a bottom electrode 346 (e.g., a first conductive layer), a top electrode 342 (e.g., a second conductive layer), and a piezoelectric (PZ) layer 344 (e.g., a AlN layer). The top electrode and bottom electrode can comprise molybdenum or other conductive material.

The first FBAR 320 and the second FBAR 340 are acoustically isolated from the underlying FBAR wafer 310. Acoustic isolation may be achieved by disposing the FBAR resonator 320, 340 over a cavity or air gap as shown in FIG. 3. Alternatively an acoustic reflector (e.g., a Bragg acoustic reflector) may be fabricated underneath the FBAR resonator. The acoustic reflector can be implemented with one or more layers of material (e.g., solid, rigid layers of material with a high refractive index). In one embodiment, the acoustic Bragg reflector is implemented with alternating layers of high acoustic velocity layers and low acoustic velocity layers. For example, the acoustic Bragg reflectors can include six pairs of alternating high acoustic velocity layers and low acoustic velocity layers.

It is noted that the second FBAR 340 can have a thickness that is different from the thickness of the first FBAR 320. This difference in thickness can be utilized to sensitize one of the FBARs to a TEV while the other FBAR is less sensitive to the TEV. The difference in the thickness of the FBARs may be achieved by mass loading one of the FBARs while not mass loading the other FBAR. In one example, after mass loading, the first FBAR has a first thickness while the second FBAR has a second thickness.

Another methods to sensitize one FBAR to an environmental variable more than a second FBAR include, but are not limited to, changing the area of the active element to affect changes to the capacitive load or impedance, changing the density of the materials of the top electrode, bottom electrode, or piezoelectric layer, employing a variable capacitance to slighty change or adjust the frequency of one of the resonators.

The TEV detection apparatus 100 can include a first gain element 330, a second gain element 350, an envelope detection 360 and other circuits 370. In one embodiment, these components (e.g., 320, 330, 340, 350, 360 and 370) manufactured on a FBAR wafer 310 may be encapsulated with a second wafer 380. This capping wafer 380 encapsulates the components manufactured on the FBAR wafer 310 to protect those components from damage. Fabrication and use of the capping wafer (also known as a microcap) are described in U.S. Pat. Nos. 6,228,675; 6,265,246, and 6,376, 280 for example. In this embodiment, the second wafer 380 may be manufactured separately from the FBAR wafer 310.

In an alternative embodiment, a capping wafer 380 is manufactured or fabricated in such a way as to be flexible so that the capping wafer 380 can deform or move with respect to one or both of the FBAR resonators 320, 340. In this manner, changes in the external pressure cause the resonant frequency of the FBAR resonators to change. In other words, the resonant frequency of the FBAR resonators is changed or varied by the TEV.

The side-by-side FBAR oscillator structure can be utilized to realize TEV a detection apparatus that detects a target environmental variable (e.g., pressure sensor, microphone, accelerometer, or vibrometer).

Since the FBAR resonator is a very high Q resonator, the fundamental phase noise of the FBAR resonator's resonant frequency is very low. The low fundamental phase noise allows the TEV detection apparatus according to the invention to detect very small changes in resonant frequency, which correspond to changes in the target environmental variable (e.g., changes in the factor being measured), such as pressure, acceleration or other environmental factors.

Embodiment with Two Side-by-Side FBAR Oscillators

In one embodiment, the TEV detection apparatus embodiment of the invention includes a first FBAR oscillator and a second FBAR oscillator that are configured or arranged in a side-by-side configuration. By utilizing two FBAR oscillators, unwanted signals (e.g., noise, unwanted effects due to drift, other process variables, and other signals not relevant to the measurement of a target environmental variable (e.g., pressure, acceleration, etc.)) are differentially canceled, thereby leaving an output signal that more accurately represents the factor to be measured.

Specifically, according to one embodiment of the invention, a first FBAR oscillator and a second FBAR oscillator that are configured or arranged in a side-by-side configuration are provided. The first FBAR oscillator has a first resonant frequency, and the second FBAR has a second resonant frequency. By observing the beat frequency of the two oscillators (e.g., the first and second FBAR oscillators), the target environmental variable may be detected.

For example, a first signal at the resonant frequency of the first FBAR oscillator may be mixed with the a second signal at the resonant frequency of the second FBAR oscillator to detect a change in the TEV. In this manner, a very small change in the resonant frequency of one of the oscillators (e.g., the first FBAR oscillator) may be detected.

One advantage of this embodiment over an embodiment that only includes a single FBAR oscillator is that the two FBAR oscillators drift similarly so that any changes of the resonant frequency of the FBARs due to drift (e.g., changes in non-target environmental variables or factors) are canceled out in a differential fashion when the two signals from the two FBARs are mixed together. The types of drift that may be canceled out by this side-by-side configuration include process drift (e.g., process variations and wafer to wafer process variations in manufacturing) and long term drift (e.g., physical degradation or aging of the resonator).

In one embodiment, the side-by-side (e.g., differential) oscillators both see the same temperature drift due to their proximity, and also both see the same process variations that would occur from die-to die, wafer-to wafer, and run-to-run. When the information from either a pair of oscillators or three oscillators is converted into two or three beat frequencies, respectively, the local temperature of the two or three oscillators may be extracted by comparing the absolute frequency shift (or the third beat frequency for three oscillators) versus a frequency standard. By knowing the temperature coefficient of frequency (TCF), one can then extract the local temperature seen by the TEV oscillator and a neighboring control oscillator or neighboring control oscillators.

Employing three oscillators provides an advantage is that a quartz resonator may be utilized as a frequency standard. Quartz resonators operate at around 5 to 50 MHz. The three oscillators can be utilized to create three beat frequencies. One beat frequency can be set to be near the quartz resonator frequency, and another beat frequency can be used to extract pressure. In one embodiment, a first oscillator is the TEV oscillator and operates at 1.00 GHz. A second oscillator is the control oscillator and operates at 1.02 GHz (a 20 MHz offset). It is noted that the beat frequency contains pressure information and temperature information. A third oscillator is set to operate at 1.07 GHz. Assume that a quartz frequency reference is set at 50 MHz. There are now three beat frequencies from the three oscillators: 20 MHz, 50 MHz and 70 MHz.

After filtering out the 50 MHz, the 70 MHz beat frequency is compared to 50 MHz (i.e., the frequency standard generated by a quartz oscillator). When the change in frequency (DELTA_freq) (e.g., 70 MHz−50 MHz-quartz) increases from 20 MHz to 21 MHz, then it is determined that the temperature has decreased. When the TCF is −100 ppm/C, and the DELTA_freq increases from 20 to 21 MHz, the temperature has decreased by [1 MHz/1000 MHz/−100 ppm/C=−10 C]. It is noted that this computation can employ a calibration point (e.g., the frequency of the resonators at 25 C).

It is noted that the side-by-side configuration (differential) of FBAR oscillators in addition to providing information regarding the TEV can provide local information on temperature. This information can be transmitted wirelessly to a remote site, which in turn can extract the TEV and temperature by using a frequency standard, TCF, and the frequency of the oscillators at a predetermined calibration temperature (e.g., 25 C).

Figure 4:
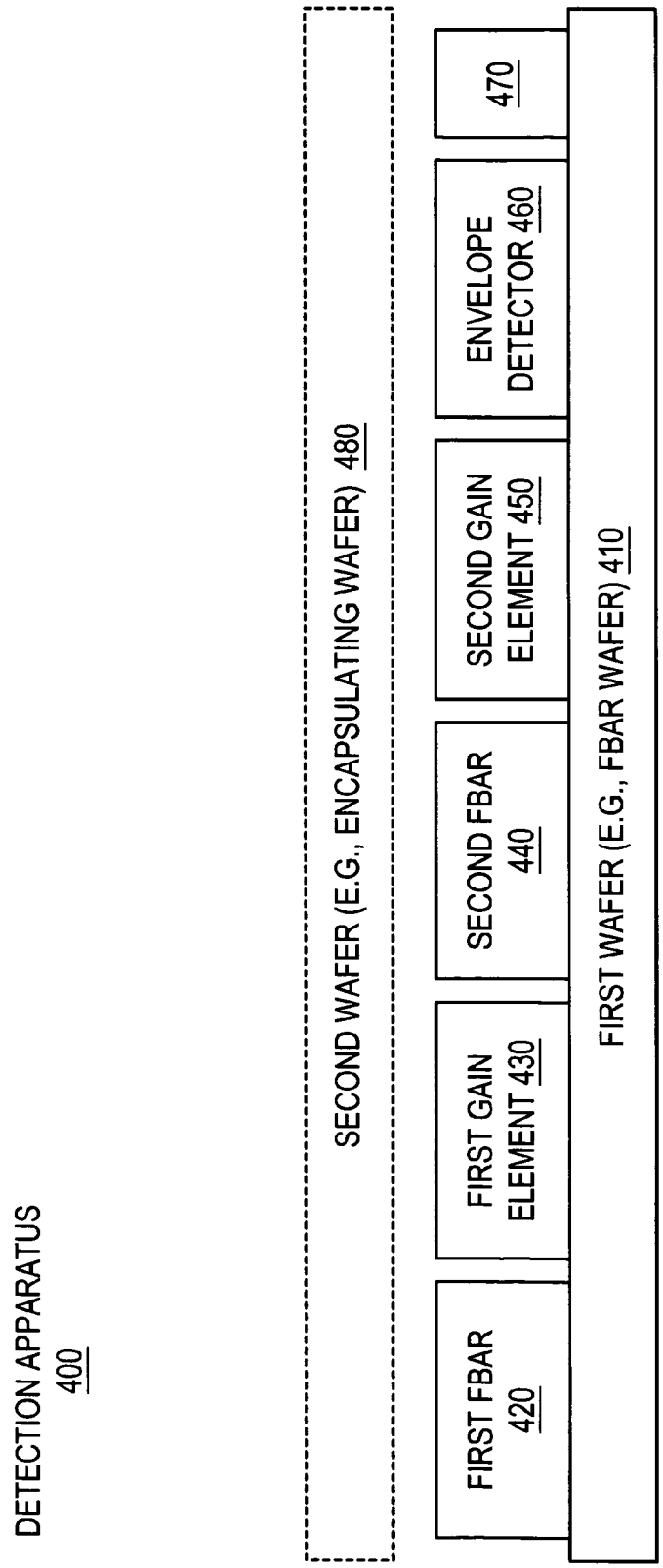
FIG. 4 illustrates a first exemplary implementation of FIG. 1, where the components are formed on a first wafer according to a one embodiment of the invention.

First Exemplary Implementation of Target Environmental Variable Detection Apparatus FIG. 4 illustrates a first exemplary implementation of the TEV detection apparatus of FIG. 1, where the components are formed on a first wafer according to a one embodiment of the invention. The target environmental variable (TEV) detection apparatus 400 includes a first wafer 410, such as a FBAR wafer and optionally a second wafer 480 that is coupled to the first wafer 410. For example, the first wafer 410 and the second wafer 480 can be coupled together by utilizing wafer-to-wafer bonding techniques that are known to those of ordinary skill in the art.

The second wafer 480 can be an encapsulating wafer that encapsulates the first wafer 410 and the components manufactured on the first wafer 410. For example, the second wafer 480 can be a micro-cap wafer.

There are a plurality of circuit components manufactured on the first wafer 410. These components include, but are not limited to, a first FBAR 420, a first gain element 430, a second FBAR 440, a second gain element 450, an envelope detector 460 (e.g., a diode), and other circuits 470. Other circuits 470 can include circuits to transmit signals representing the TEV to a receiving device through a wireless link (e.g., an radio frequency (RF) communication link) or circuits to convert an analog TEV representative signal into a corresponding digital TEV representative signal.

Figure 5:
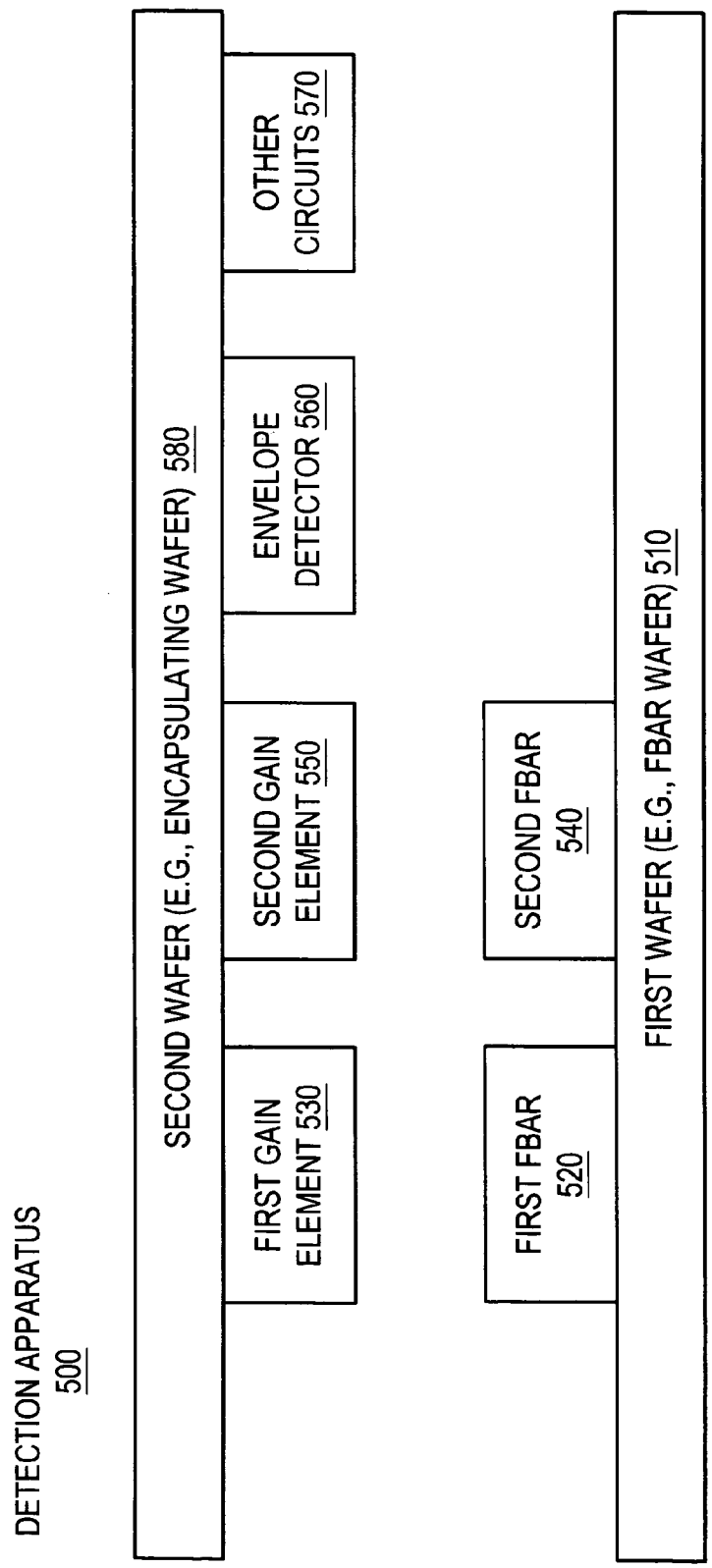
FIG. 5 illustrates a second exemplary implementation of FIG. 1, where the components are formed on a second encapsulating wafer according to a one embodiment of the invention.

Second Exemplary Implementation of Target Environmental Variable Detection Apparatus FIG. 5 illustrates a second exemplary implementation of the TEV detection apparatus FIG. 1, where the components are formed on a second encapsulating wafer according to a one embodiment of the invention.

The target environmental variable (TEV) detection apparatus 500 includes a first wafer 510, such as a FBAR wafer and a second wafer 580 that is coupled to the first wafer 410. For example, the first wafer 510 and the second wafer 580 can be coupled together by utilizing wafer-to-wafer bonding techniques that are known to those of ordinary skill in the art. The second wafer 580 can be an encapsulating wafer that encapsulates the first wafer 510 and the components manufactured on the first wafer 510. For example, the second wafer 580 can be a micro-cap wafer.

There is a plurality of circuit components manufactured on the first wafer 510. These components include, but are not limited to, a first FBAR 520 and a second FBAR 540. Also, there is a plurality of circuit components manufactured on the second wafer 580. These components include, but are not limited to, a first gain element 530, a second gain element 550, an envelope detector 560 (e.g., a diode), and other circuits 570. Other circuits 570 can include circuits to transmit signals representing the TEV to a receiving device through a wireless link (e.g., an radio frequency (RF) communication link) or circuits to convert an analog TEV representative signal into a corresponding digital TEV representative signal.

Method for Utilizing FBAR Oscillators to Determine a Target Environmental Variable (TEV)

Figure 6:
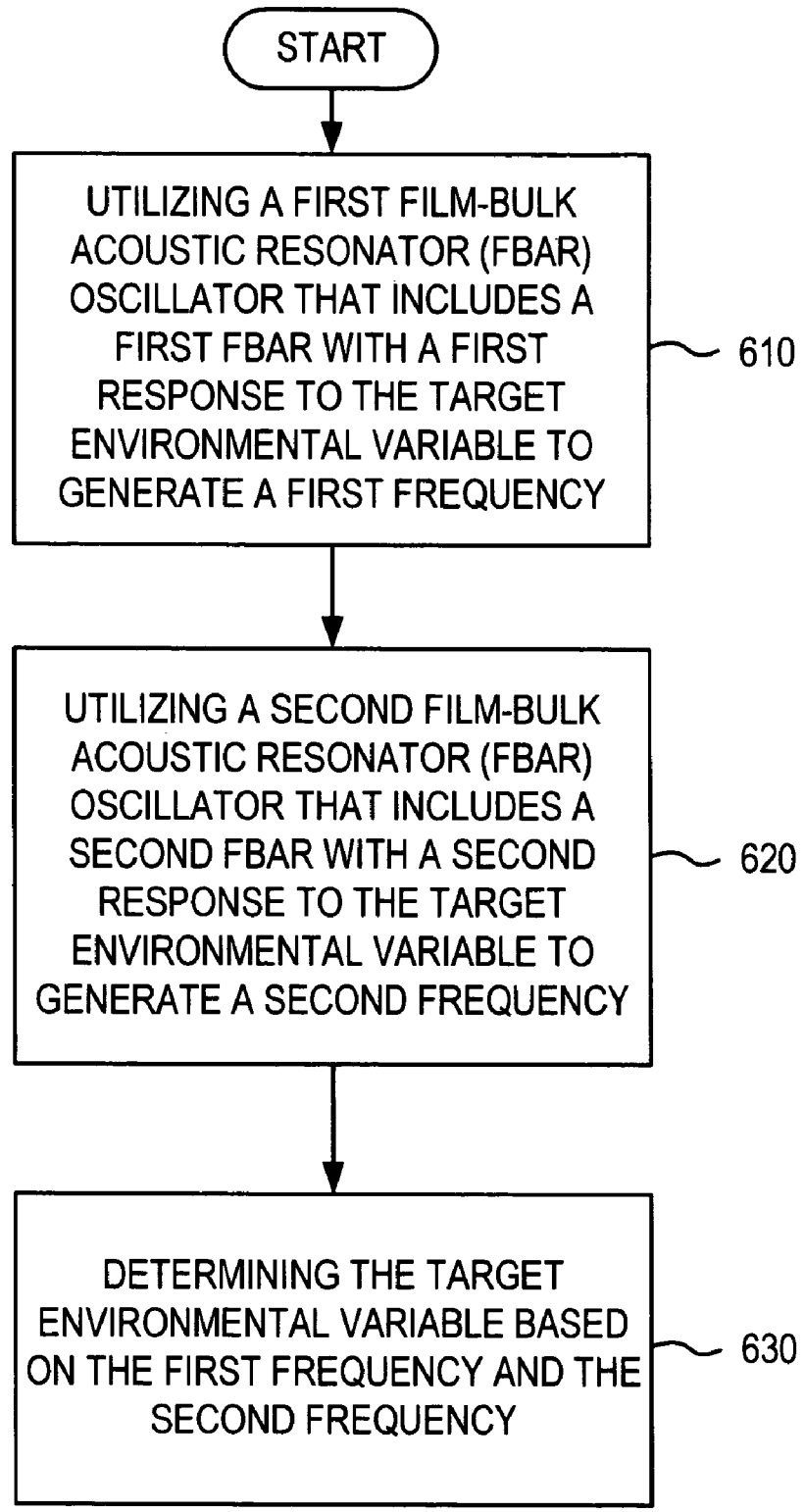
FIG. 6 is a flowchart illustrating a method for detecting a target environmental variable (TEV) by utilizing FBAR oscillators according to one embodiment of the invention.

FIG. 6 is a flowchart illustrating a method for detecting a target environmental variable by utilizing FBAR oscillators according to one embodiment of the invention. In step 610, a first film-bulk acoustic resonator (FBAR) oscillator that includes a first FBAR with a first response to the target environmental variable is utilized to generate a first frequency. In step 620, a second film-bulk acoustic resonator (FBAR) oscillator that includes a second FBAR with a second response to the target environmental variable is utilized to generate a second frequency. In step 630, the target environmental variable is detected or determined based on the first frequency and the second frequency. In one embodiment, this step of determination or detection includes measuring the target environmental variable or detecting a change in the target environmental variable.

Method for Manufacturing a Target Environmental Variable Detection Apparatus

Figure 7:
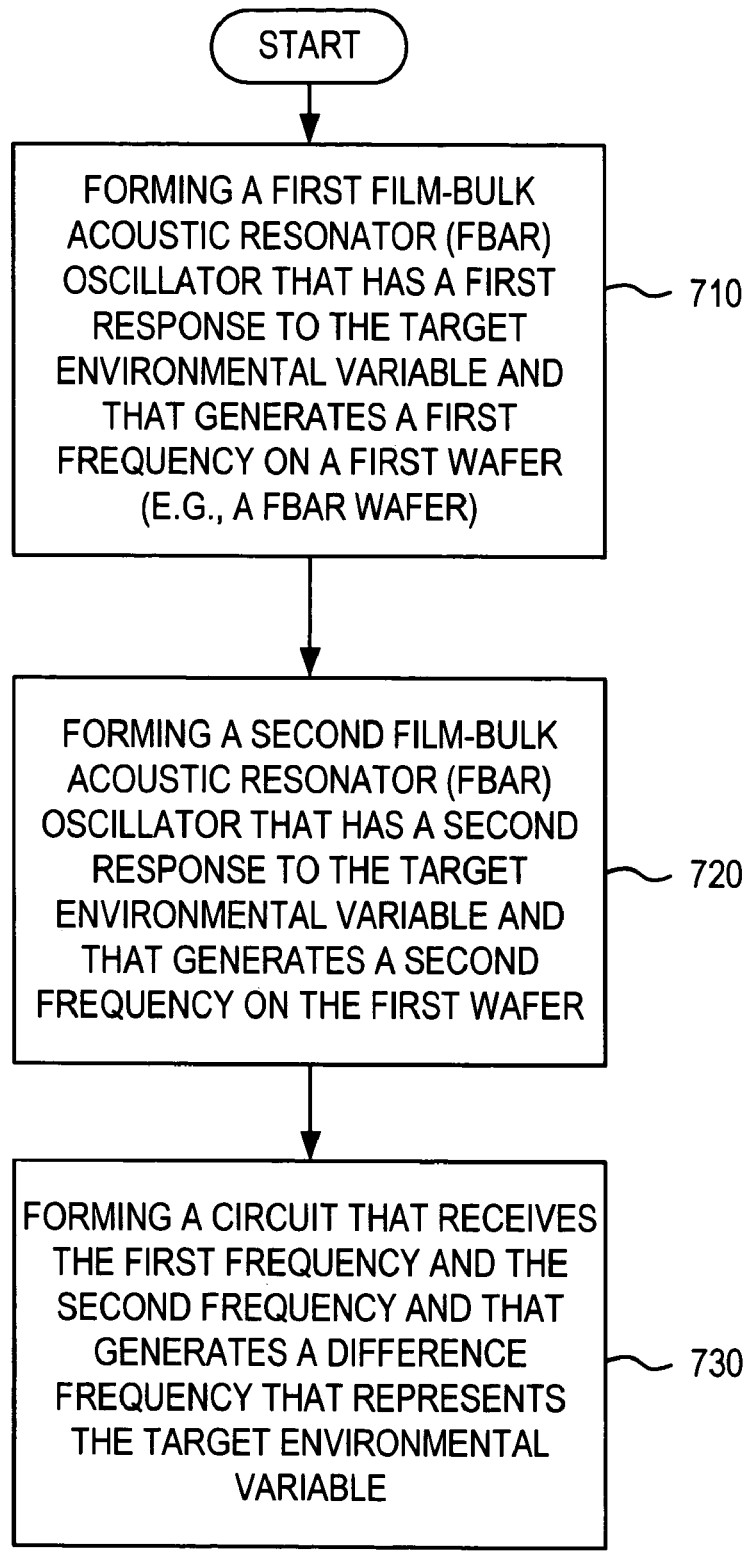
FIG. 7 is a flowchart illustrating a method for manufacturing a target environmental variable (TEV) detection apparatus according to one embodiment of the invention.

FIG. 7 is a flowchart illustrating a method for manufacturing a target environmental variable detection apparatus according to one embodiment of the invention. In step 710, a first film-bulk acoustic resonator (FBAR) oscillator that has a first response to the target environmental variable and that generates a first frequency is formed on a first wafer (e.g., a FBAR wafer). Step 710 can include the steps of forming a first FBAR in the first wafer and forming a first gain element in the first wafer. In step 720, a second film-bulk acoustic resonator (FBAR) oscillator that has a second response to the target environmental variable and that generates a second frequency is formed on the first wafer. Step 720 can include the steps of forming a second FBAR in the first wafer and forming a second gain element in the first wafer. It is noted that the first and second gain elements may also be formed in a second wafer (e.g., a micro-cap wafer). The second wafer can then be bonded to the first wafer with techniques that are known to those of ordinary skill in the art. In step 730, a circuit that receives the first frequency and the second frequency and generates a difference frequency that represents the target environmental variable is formed. For example, the circuit formed in step 730 may be formed on a FBAR wafer or on a micro-cap wafer. It is noted that other processing steps may be included, such as, encapsulating the first wafer (e.g., forming a micro-cap wafer and bonding the micro-cap wafer to the FBAR wafer), forming other circuits (e.g., envelope detector 360, transmitters, and other circuits 370).

Exemplary Pressure Detection Apparatus 800

Figure 8:
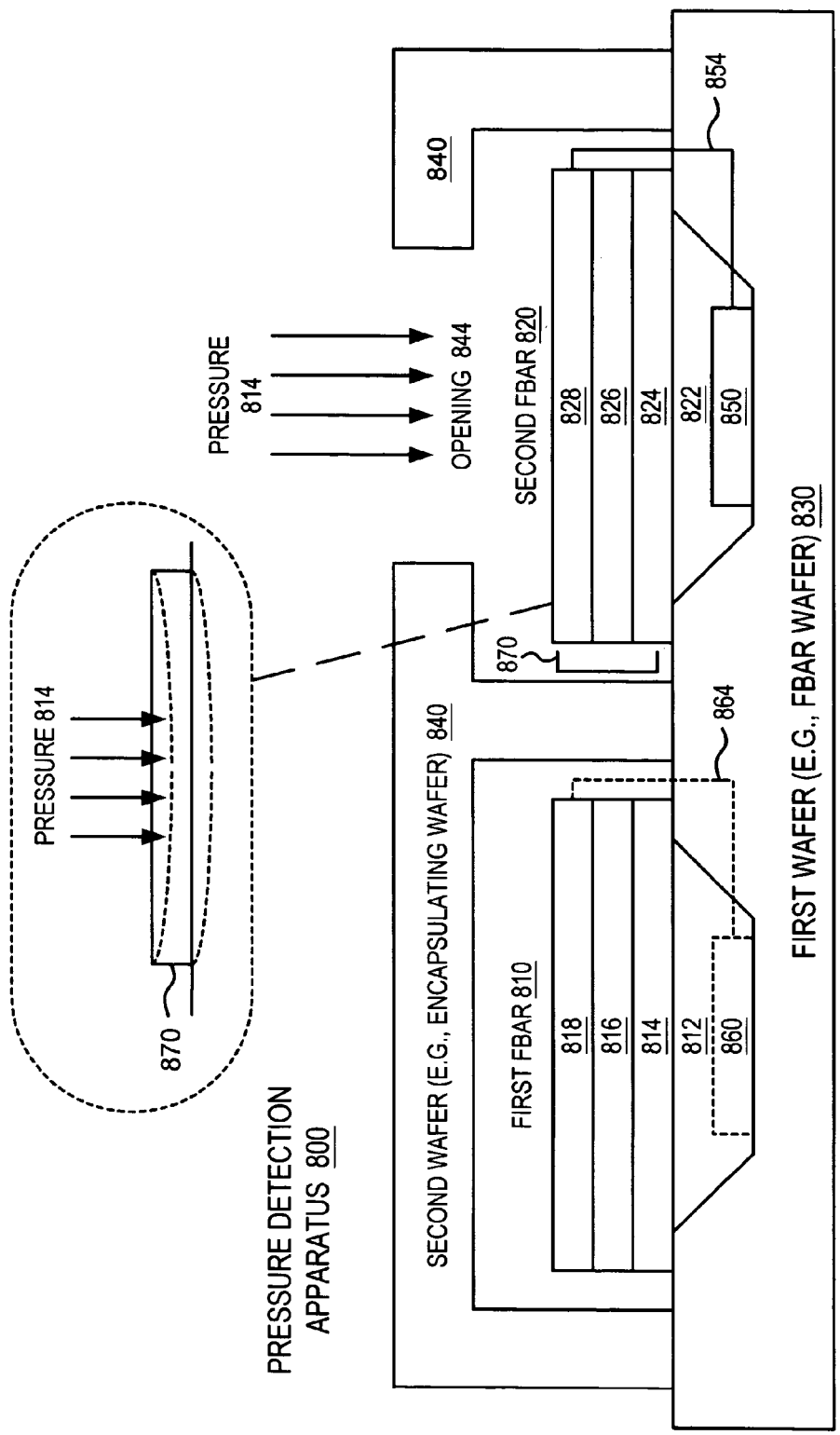
FIG. 8 illustrates an exemplary pressure detection apparatus according to one embodiment of the invention.

FIG. 8 illustrates an exemplary pressure detection apparatus 800 according to one embodiment of the invention. The pressure detection apparatus 800 includes a first FBAR 810 and a second FBAR 820 that comprise a pair of differential FBARs. The pressure detection apparatus 800 includes a first wafer 830 (e.g., a FBAR wafer or substrate) on which the FBARs 810, 820 are formed and a second wafer 840 (e.g., an encapsulating wafer or micro-cap wafer). The first FBAR 810 includes a swimming pool 812, a first electrode 814 (referred to hereinafter also as "bottom electrode for the first FBAR"), a piezoelectric (PZ) layer 816, and a second electrode 818 (referred to hereinafter also as "bottom electrode for the first FBAR"). The second FBAR 820 includes a swimming pool 822, a first electrode 824 (referred to hereinafter also as "bottom electrode for the second FBAR"), a piezoelectric (PZ) layer 826, and a second electrode 828 (referred to hereinafter also as "bottom electrode for the second FBAR").

The first FBAR 810 is encapsulated by the micro-cap wafer 840 and not exposed to the atmosphere. The second FBAR 820 is exposed to the atmosphere in order to detect changes in the pressure. For example, a portion of the micro-cap wafer 840 that is disposed above the second FBAR 820 is opened up to atmosphere.

A difference frequency is created between the two oscillators. In a one embodiment, the two oscillators operate at an operating frequency of about 2 GHz, and the difference frequency is about 2 MHz or about $\frac{1}{1000}$ of the operating frequency (i.e., the difference frequency is equal to the operating frequency divided by a factor, such as 1000).

In one embodiment, a parallel capacitor is formed with respect to one or both of the FBARs 810, 820. In this example, a parallel capacitor is formed with respect to the second FBAR 820. It is noted that the parallel capacitor may be formed with respect to the FBAR that is exposed to atmosphere (e.g., the second FBAR 820), with respect the FBAR that is not exposed to atmosphere (e.g., the first FBAR 810), or with respect to both FBARs 810, 820.

One exemplary manner in which to achieve or realize a parallel capacitor is to add or form a third electrode 850 (e.g., an electrode made from a conductive material) in the bottom of the swimming pool 822 and to couple the third electrode 850 to the top electrode 828 of the second FBAR through a conductive path 854. In this manner, the top electrode 828 is electrically coupled to the third electrode 850 to realize a parallel capacitor. In a similar manner, a third electrode 860 (e.g., an electrode made from a conductive material) may be optionally formed in the bottom of the swimming pool 812, and the third electrode 860 may be optionally coupled to the top electrode 818 of the first FBAR through a conductive path 864. In this manner, the top electrode 818 is electrically coupled to the third electrode 860 to realize a parallel capacitor in the first FBAR 810.

As the bottom electrode 824, piezoelectric (PZ) layer 826, and the top electrode 828 (hereinafter referred to collectively as "membrane" 870) moves in response to changes in pressure, the parallel capacitance changes. For example, FIG. 8 illustrates how the pressure 814 can cause the membrane 870 to flex or bend, thereby causing a change in the parallel capacitance. This change in capacitance changes the frequency of the second FBAR 820 that is exposed to the pressure (e.g., the FBAR that is exposed to or opened up to the atmosphere).

According to another embodiment of the invention, the TEV detection device also includes a low power radio. It is noted that the low power radio (e.g., a low power transmitter) may be manufactured with the same fabrication process that is utilized to manufacture the TEV detection apparatus that employs at least one FBAR oscillator. By integrating a low power radio with the TEV detection apparatus, the TEV detection apparatus according to the invention can be remotely queried by a querying device. In response, the TEV detection apparatus can transmit the TEV representative signal (TRS) (e.g., a detected frequency shift) to the querying device. Since the FBAR radio is relatively compact, and the TEV detection apparatus that employs a FBAR oscillator is also relatively compact, the overall package for the radio and the measuring device according to the invention is also relatively compact.

A TEV detection apparatus that employs FBAR oscillators according to the invention may be implemented in a variety of different consumer, industrial, and military applications where precise and reliable measurement of an environmental variable is required. These applications include automotive airbag and safety applications, automotive security applications, applications motion detection applications, electronic braking systems, precision navigation systems, stability compensation for industrial equipment, physiological monitoring (medical instrumentation/diagnostic equipment), and stabilization/tilt correction for antenna systems.

In the foregoing specification, the invention has been described with reference to specific embodiments thereof. It will, however, be evident that various modifications and changes may be made thereto without departing from the broader scope of the invention. The specification and drawings are, accordingly, to be regarded in an illustrative rather than a restrictive sense.

What is claimed is:

1. An apparatus that detects a target environmental variable comprising:
   a first film-bulk acoustic resonator (FBAR) oscillator that includes a first FBAR with a first response to the target environmental variable; wherein the first FBAR oscillator generates a first frequency;
   a second film-bulk acoustic resonator (FBAR) oscillator that includes a second FBAR with a second response to the target environmental variable; wherein the second FBAR oscillator generates a second frequency; and
   a circuit that detects changes in the target environmental variable based on the first frequency and the second frequency.

2. The apparatus of claim 1 wherein the first FBAR oscillator and the second FBAR oscillator detect a difference in the response of the first FBAR to the target environmental variable and the response of the second FBAR to the target environmental variable and extinguish effects on the response of the first FBAR and the response of the second FBAR caused by non-target environmental variables to which the first FBAR and the second FBAR are exposed.

3. The apparatus of claim 1 wherein the circuit measures the difference between the first frequency and the second frequency.

4. The apparatus of claim 1 wherein the first FBAR includes
   a FBAR wafer;
   an acoustic reflector formed in the FBAR wafer that includes a surface; a first electrode formed on the surface of the acoustic reflector;
   wherein the first electrode includes a surface;
   a piezoelectric layer formed on the surface of the first electrode;
   wherein the piezoelectric layer includes a surface; and
   a second electrode formed on the surface of the piezoelectric layer.

5. The apparatus of claim 4 wherein the second FBAR includes
   a second acoustic reflector formed in the FBAR wafer that includes a surface;
   a third electrode formed on the surface of the second acoustic reflector; wherein the first electrode includes a surface;
   a second piezoelectric layer formed on the surface of the third electrode;
   wherein the piezoelectric layer includes a surface; and
   a fourth electrode formed on the surface of the second piezoelectric layer.

6. The apparatus of claim 1 wherein the first FBAR and the second FBAR are manufactured with different mass loading;
   wherein the different manufacturing causes the first FBAR and the second FBAR to respond differently to a target environmental variable and to generate an offset frequency that is controlled by the mass loading.

7. A method for detecting a target environmental variable comprising:
   utilizing a first film-bulk acoustic resonator (FBAR) oscillator that includes a first FBAR with a first response to the target environmental variable to generate a first frequency;
   utilizing a second film-bulk acoustic resonator (FBAR) oscillator that includes a second FBAR with a second response to the target environmental variable to generate a second frequency; and
   detecting a change in the target environmental variable based on the first frequency and the second frequency.

8. The method of claim 7 further comprising:
   employing the first FBAR oscillator and the second FBAR oscillator to detect a difference in the response of the first FBAR to the target environmental variable and the response of the second FBAR to the target environmental variable and to extinguish common effects on the response of the first FBAR and the response of the second FBAR caused by non-target environmental variables to which the first FBAR and the second FBAR are exposed.

* * * * *